United States Patent
Pfeiffer et al.

(10) Patent No.: US 6,822,923 B2
(45) Date of Patent: Nov. 23, 2004

(54) RAM MEMORY CIRCUIT AND METHOD FOR CONTROLLING THE SAME

(75) Inventors: Johann Pfeiffer, Ottobrunn (DE); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 10/425,280

(22) Filed: Apr. 29, 2003

(65) Prior Publication Data

US 2004/0008548 A1 Jan. 15, 2004

(30) Foreign Application Priority Data

Apr. 29, 2002 (DE) .......................................... 102 19 066

(51) Int. Cl.⁷ .............................. G11C 8/00; G11C 7/00
(52) U.S. Cl. ....................... 365/233; 365/193; 365/196; 365/203; 365/230.06
(58) Field of Search ................................ 365/233, 193, 365/196, 203, 203.06

(56) References Cited

U.S. PATENT DOCUMENTS

| | | | | |
|---|---|---|---|---|
| 5,701,143 A | * | 12/1997 | Rao | 345/545 |
| 5,826,056 A | * | 10/1998 | Noda | 711/167 |
| 6,023,437 A | * | 2/2000 | Lee | 365/203 |
| 6,192,003 B1 | * | 2/2001 | Ohta et al. | 365/233 |
| 2003/0081449 A1 | * | 5/2003 | Beucler | 365/154 |
| 2003/0120859 A1 | * | 6/2003 | Chow | 711/103 |

FOREIGN PATENT DOCUMENTS

EP          0 352 572 A2      1/1990

* cited by examiner

Primary Examiner—David Nelms
Assistant Examiner—Ly Duy Pham
(74) Attorney, Agent, or Firm—Laurence A. Greenberg; Werner H. Stemer; Gregory L. Mayback

(57) ABSTRACT

A RAM memory circuit and method for controlling the same includes memory cells disposed in a matrix of rows and columns each addressed for writing in/reading out a datum by activation of a word line assigned to a relevant row and connection of a sense amplifier assigned to a relevant column to a data path. A control device can be set by an immediate-write command, commanding the write operation, to initiate connection of the sense amplifiers selected by the column addresses provided to the data path at an instant $t_a+T_w$, where $t_a$ is the instant of activation of the word line selected by a row address provided and $T_w$ is less than a charging time $T_c$ specific to the memory circuit and is necessary, starting from a word line activation, to transfer the datum stored in a memory cell of the relevant row to the respectively selected sense amplifier and amplify it there.

18 Claims, 3 Drawing Sheets

RAM MEMORY CIRCUIT AND METHOD FOR CONTROLLING THE SAME

BACKGROUND OF THE INVENTION

Field of the Invention

The invention relates to a RAM memory circuit and method for controlling the RAM memory circuit having a multiplicity of memory cells and having addressing and control devices for accessing the memory cells for writing in and reading out data. The memory cells are disposed in a matrix form in rows and columns and each are addressed for the process of writing in or reading out a datum by activation of a word line associated with the relevant row and connection of a sense amplifier associated with the relevant column to a data path. A preferred area of application is dynamic RAMs (DRAMS), in particular, synchronous DRAMs (SDRAMs, DDR-RAMS or RDRAMs).

Dynamic random access memories, as are generally known by the acronym DRAM, contain one or more arrays or banks of memory cells that are in each case disposed in the manner of a matrix in rows and columns. Each row is assigned a row selection line, referred to as "word line" and each column is assigned a column selection line, which is referred to as "bit line" and is usually configured in two-core fashion ("bit line pair"). Each memory cell includes, in addition to a capacitor that forms the actual memory element and whose respective state "charged" or "uncharged" represents the binary or logic value "1" or "0" of the stored datum, a selection transistor that can be turned on by activation of the relevant word line. With the selection transistor in the on state, the capacitor is connected to the bit line pair to transfer the charge of the capacitor onto the bit line pair so that the stored datum can be sensed as a potential difference on the bit line pair. For sensing and evaluating the potential difference, each bit line pair is assigned a sense amplifier that is latched into a defined first or second state, depending on whether the sensed potential difference corresponds to the logic value "1" or "0" of the stored datum.

For a selective access to selected memory cells, first, a selected word line is activated by application of an activation potential (usually so-called "H" potential, which is positive with respect to the zero potential). The word line to be activated is selected depending on a row address provided, which is decoded in a row decoder. With the word line activation, the selection transistors of all the memory cells of the addressed row are turned on so that the potential differences that indicate all the data of the addressed row build up on the bit line pairs of all the columns. These data are latched in the assigned sense amplifiers. This latching operation has the effect that the sensed data are written back to the respective memory cells in amplified and, thus, refreshed form and, moreover, are ready for fetching in the sense amplifiers.

After this state has been reached, what conventionally follows is the further control of the DRAM for reading or writing, the sense amplifiers being selectively connected to a data path by actuation of selected transfer switches in order either to read out the latched data from the DRAM through the data path (read cycle) or to overwrite the data by new data (write cycle). This "column" selection is effected by selection of the transfer switches to be actuated depending on column select signals based upon column addresses that are decoded in a column decoder.

Starting from the command that initiates the activation of the selected word line, it takes a certain period of time for the sense amplifiers to reach their final state. First, it is necessary for the applied activation potential to develop along the word line until the selection transistors in the memory cells respond. Then a certain period of time elapses until the bit line pairs have accepted the charge of the memory cells and the sense amplifiers can be switched on to be driven into their latching state. Only afterward are the latched data released for read-out or overwriting. The minimum waiting time to be complied with between a word line activation command, and the start of each read or write cycle is defined in the context of the customary specification of a DRAM and, naturally, restricts the operating speed of the memory circuit.

SUMMARY OF THE INVENTION

It is accordingly an object of the invention to provide a RAM memory circuit and method for controlling the RAM memory circuit that overcome the hereinafore-mentioned disadvantages of the heretofore-known devices and methods of this general type and that reduces the sum of the waiting times during the operation of a DRAM and, thereby, increases the average operating speed.

With the foregoing and other objects in view, there is provided, in accordance with the invention, a RAM memory circuit, including a multiplicity of memory cells disposed in matrix form in rows and columns, the cells storing datum, the rows having row addresses, the columns having column addresses, word lines each being associated with a respective one of the rows, sense amplifiers each being associated with a respective one of the columns, data input/output means, a data path connected to the sense amplifiers and to the data input/output means for transferring data in either direction between the sense amplifiers and the data input/output means, each of the memory cells being addressable for writing in or reading out a datum by activation of the one word line associated with a respective one of the rows and by connecting a sense amplifier associated with a respective one of the columns to the data path, an addressing device having a row decoder connected to the word lines for selecting the word line to be activated dependent upon a provided row address and a column decoder connected to the sense amplifiers for selecting respective ones of the sense amplifiers to be connected to the data path dependent upon the column addresses provided thereto, and a control device connected to the word lines, the control device activating a selected one of the word lines and subsequently initiating a connection of the selected sense amplifiers to the data path, the control device, upon receiving an immediate-write command, being set to command a write operation to initiate a connection of the sense amplifiers selected by the column address provided to the data path at an instant $t_a+T_w$, where $t_a$ is an instant of an activation of the word line selected by the provided row address and $T_w$ is less than a charging time necessary, starting from the word line activation, to transfer the datum stored in one of the memory cells of the respective one of the rows to the respectively selected sense amplifier and to amplify the datum at the respectively selected sense amplifier.

Accordingly, the invention is realized on a RAM memory circuit that contains the following: a multiplicity of memory cells, which are disposed in matrix form in rows and columns and can each be addressed for the process of writing in or reading out a datum by activation of a word line assigned to the relevant row and connection of a sense amplifier assigned to the relevant column to a data path, an addressing device with a row decoder for the selection of the word line to be activated depending on a row address provided, and with a column decoder for the selection of the sense amplifiers to be connected to the data path depending on column addresses provided; a control device that is configured for the activation of the selected word line and for the subsequent initiation of the connection of the selected sense amplifiers to the data path. According to the invention, the control device can be set by an immediate-write command, which commands the write operation, such that it initiates the connection of the sense amplifiers selected by the column addresses provided to the data path at an instant $t_a+T_w$, where $t_a$ is the instant of the activation of the word line (WL) selected by the row address provided and $T_w$ is less than the charging time $T_c$ that is specific to the memory circuit and is necessary, starting from a word line activation, in order to transfer the datum stored in a memory cell of the relevant row to the respectively selected sense amplifier and to amplify it there.

The invention is based on the insight that, for writing data at memory cells of a selected row, it is not actually necessary to wait, after the activation of the relevant word line, until the sense amplifiers of those columns in which the relevant memory cells are located have reached their state that evaluates and latches the previous datum. This means that sense amplifiers that are intended to receive write data can be switched on practically at the same time as the activation of the word line, and that the column selection can begin without delay to connect the sense amplifiers to the data path carrying the write data and to write the data at the relevant memory cells without delay. Although this saving of waiting time only takes place during writing, the overall result is an increase in the average operating speed, particularly if there is frequent alternation between reading and writing during the operation of the memory, that is to say, a frequent initiation of write cycles has to take place.

A further advantage of the invention is that, by virtue of the advanced beginning of the write cycle, not only waiting time but also current is saved because the current-wasting charging of the bit lines and driving of the sense amplifiers to the previously stored data values are obviated.

To be able to optimally utilize the possibility of the brought-forward beginning of a write cycle, the addressing device of the RAM must be configured such that it provides the column addresses in valid fashion, and decodes them, as early as possible before the charging time $T_c$ has elapsed. In the case of the DRAMs sold under the proprietary name "RDRAM" by the company Rambus Inc., this can easily be realized because, in this case, row and column addresses succeed one another in a very narrow time frame through a particular bus system that also transfers the data and further control signals.

In accordance with another feature of the invention, there is provided an address-providing device providing column addresses, at the latest, at an instant $t_r+T_w$, where $t_r$ is an instant at which a row address is provided.

In accordance with a further feature of the invention, the address-providing device has means for simultaneously providing a row address and a column address.

In accordance with an added feature of the invention, the address-providing device has an address input with separate input terminals for receiving an externally applied row address and an externally applied column address.

In accordance with an additional feature of the invention, the address-providing device has an address provider simultaneously providing a row address and a column address.

In accordance with yet another feature of the invention, the address-providing device has an address input with separate input terminals for receiving an externally applied row address and an externally applied column address.

In accordance with yet a further feature of the invention, there is provided a first address bus transferring the row addresses and a second address bus transferring the column addresses, the address-providing device being connected to the row decoder through the first address bus and being connected to the column decoder through the second address bus.

In accordance with yet an added feature of the invention, the sense amplifiers have inputs and $T_w$ is equal to a safety time $T_b$, and $T_w$ elapses starting from an activation of the word line until a signal change, determined by the datum in the memory cells of the relevant row, at the inputs of the associated sense amplifier has reached a level that can be unambiguously discriminated from noise phenomena.

In accordance with yet an additional feature of the invention, the control device has a control signal generator for generating a first control signal for activating the selected word line and for generating a second control signal for connecting the selected sense amplifiers to the data path in accordance with temporal stipulations of an immediate-write execution program activated by the immediate-write command and, in an event of an activation of the immediate-write execution program, causes the control signal generator to generate the second control signal within a time frame $T_w<T_c$ beginning with activation of the word line.

In accordance with again another feature of the invention, the word lines, the sense amplifiers, the memory cells, the data path, the addressing device and the control device form a synchronous DRAM memory circuit.

In accordance with yet another feature of the invention, the RAM memory circuit is a synchronous DRAM memory circuit With the objects of the invention in view, there is also provided a method for controlling an operation of writing data into a RAM memory circuit, including the steps of providing a memory circuit having a multiplicity of memory cells disposed in matrix form in rows and columns, the cells storing datum, the rows having row addresses, the columns having column addresses, word lines each being associated with a respective one of the rows, sense amplifiers each being associated with a respective one of the columns, data input/output means, a data path for transferring data in either direction between the input/output means and the sense amplifiers, and each memory cell being addressable for writing in or reading out a datum by activation of the one word line associated with a respective one of the rows and by connecting of a sense amplifier associated with a respective one of the columns to the data path, providing an addressing device having a row decoder connected to the word lines for selecting the word line to be activated dependent upon a provided row address and a column decoder connected to the sense amplifiers for selecting respective ones of the sense amplifiers to be connected to the data path dependent upon the column addresses provided thereto, activating a selected one of the word lines and subsequently initiating a connection of at least one associated selected sense amplifier to the data path, initiating a connection of the selected sense amplifier selected by the column address provided to the data path at an instant $t_a+T_w$, where $t_a$ is an instant of an activation of the word line selected by the provided row address and $T_w$ is less than a charging time necessary, starting from the word line activation, to transfer the datum stored in one of the memory cells of the respective one of the rows to the respectively selected sense amplifier and to amplify the datum at the respectively selected sense amplifier.

With the objects of the invention in view, there is also provided a method for controlling an operation of writing data into a RAM memory circuit, including the steps of disposing a multiplicity of memory cells in a matrix of rows and columns, the cells storing datum, the rows having row addresses, the columns having column addresses, associating each of the word lines with a respective one of the rows, associating each of the sense amplifiers with a respective one of the columns, connecting a data path to a data input/output device and to the sense amplifiers for transferring data in either direction between the input/output device and the sense amplifiers, each memory cell being addressable for writing in or reading out a datum by activation of the one word line associated with a respective one of the rows and by connecting of a sense amplifier associated with a respective one of the columns to the data path, connecting a row decoder of an addressing device to the word lines for selecting the word line to be activated dependent upon a provided row address, connecting a column decoder of the addressing device to the sense amplifiers for selecting respective ones of the sense amplifiers to be connected to the data path dependent upon the column addresses provided thereto, selecting one of the word lines by activating the selected word line and subsequently initiating a connection of at least one associated selected sense amplifier to the data path, initiating a connection of the selected sense amplifier selected by the column address provided to the data path at an instant $t_a+T_w$, where $t_a$ is an instant of an activation of the word line selected by the provided row address and $T_w$ is less than a charging time necessary, starting from the word line activation, to transfer the datum stored in one of the memory cells of the respective one of the rows to the respectively selected sense amplifier and to amplify the datum at the respectively selected sense amplifier.

In the case of other conventional DRAMs, including the increasingly common "synchronous" variants (SDRAMs), the same external terminals (pins) are used for applying the column address bits as for applying the row address bits, in order to keep down the total number of pins. In the case of this customary address multiplex method, first, the row address for the selection of the word line is applied, and only after the valid decoding thereof is there an opportunity for applying one or more successive column addresses for the selection of the memory cells that are to be read from or written to within the selected row (that is to say, for the selection of the sense amplifiers to be connected to the data path). If this address multiplex cannot be accelerated to a sufficient extent to provide the first valid column address early before the charging time $T_c$ has elapsed, separate pins for row and column addressees should, preferably, be provided for the realization of the invention, which allows a simultaneous application of row and column addresses. This can even be realized without significantly increasing the space requirement, by using so-called ball grid arrays in which, in contrast to the currently predominant TSOP housings (which have contact regions at the side), the entire housing underside is occupied by contacts, with the result that a larger number of contacts can be accommodated.

In accordance with again a further feature of the invention, wherein the control device has a command decoder decoding the immediate-write command from externally applied command bits.

In accordance with again an added feature of the invention, the command decoder decodes the immediate-write command from two directly successively applied words of m externally applied command bits in each case.

In accordance with again an additional feature of the invention, there is provided an input for application of an externally generated immediate-write command, the control device having a command decoder activating the immediate-write execution program in the control signal generator upon reception of the externally generated immediate-write command.

In accordance with a concomitant feature of the invention, there is provided an input for application of an externally generated immediate-write command, the input being connected to the control signal generator to activate, upon reception of the externally generated immediate-write command, the immediate-write execution program in the control signal generator.

Other features that are considered as characteristic for the invention are set forth in the appended claims.

Although the invention is illustrated and described herein as embodied in a RAM memory circuit and method for controlling the RAM memory circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
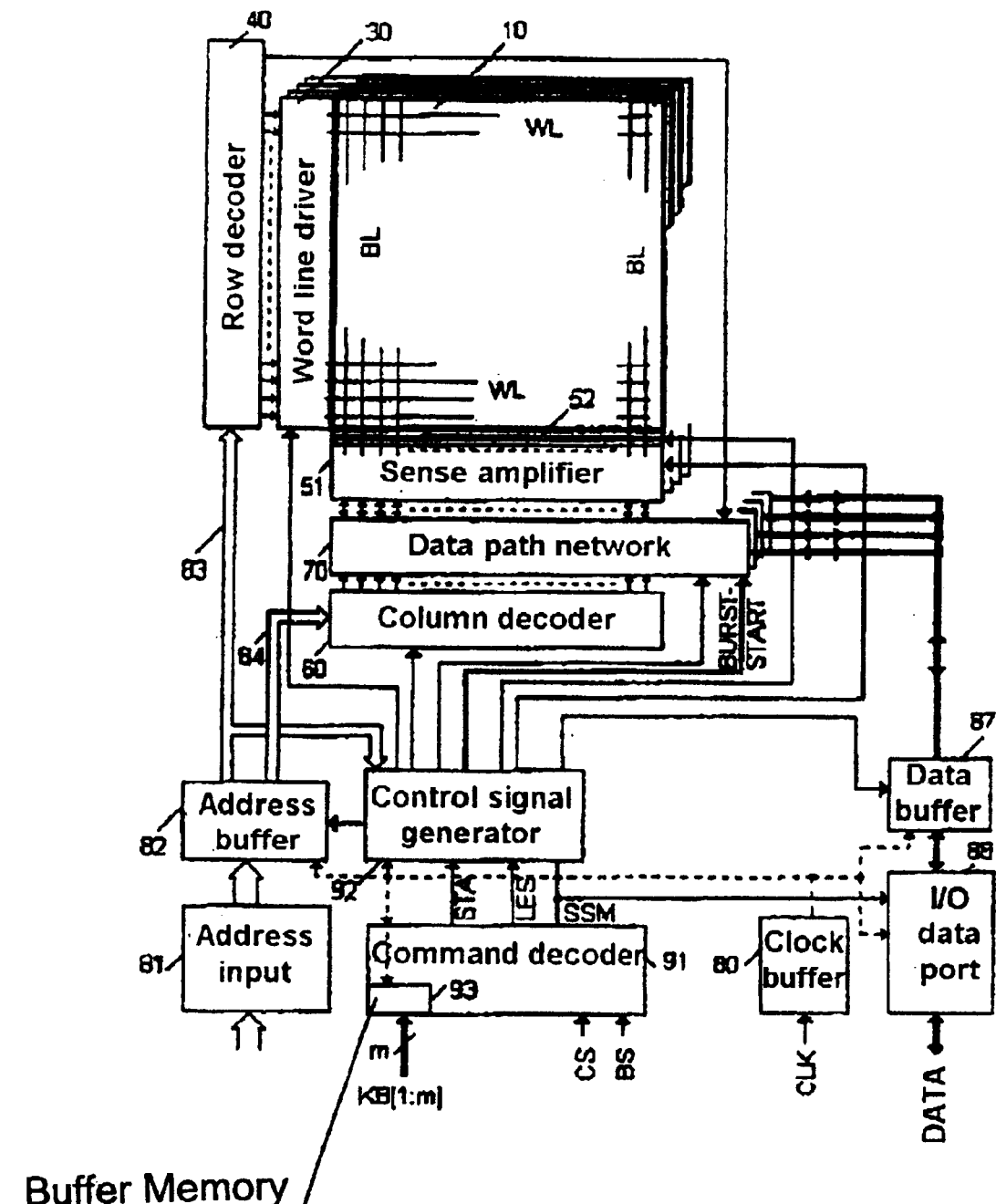
FIG. 1 is a block circuit diagram of a DRAM memory circuit according to the invention.

Referring now to the figures of the drawings in detail and first, particularly to FIG. 1 thereof, there is shown a memory circuit, which is, preferably, integrated on a single chip ("memory module"), and contains, as memory medium, four memory banks each including a matrix 10 with a multiplicity of memory cells disposed in rows and columns, each row being assigned a word line WL and each column being assigned a bit line BL. The memory cells (not shown in FIG. 1) lie near the crossovers of the bit and word lines. Selective access to the memory cells for reading and writing is effected by activation of the relevant word line WL and connection of the relevant bit line BL to a data path that runs through a data path network 70, a data buffer 87, and a bidirectional input/output data port (I/O data port) of the memory circuit.

To activate the word lines WL, a multiplicity of word line drivers 30 are provided for each memory matrix 10, each of the drivers 30 being connected to an individually assigned word line WL. Each of the word line drivers 30 can be driven by a row decoder 40 depending on the bits of a row address that can be fed to the row decoder from an address input 81 through an address buffer 82 and a row address bus 83. The selective connection of the bit lines BL to the data buffer 87 is effected through assigned sense amplifiers 51 and selectively controllable data line switches in the data path network 70. These data line switches are controlled by a column decoder 60 depending on the bits of a column address that can be fed to the column decoder from the address input 81 through the address buffer 82 and a column address bus 84.

Figure 2:
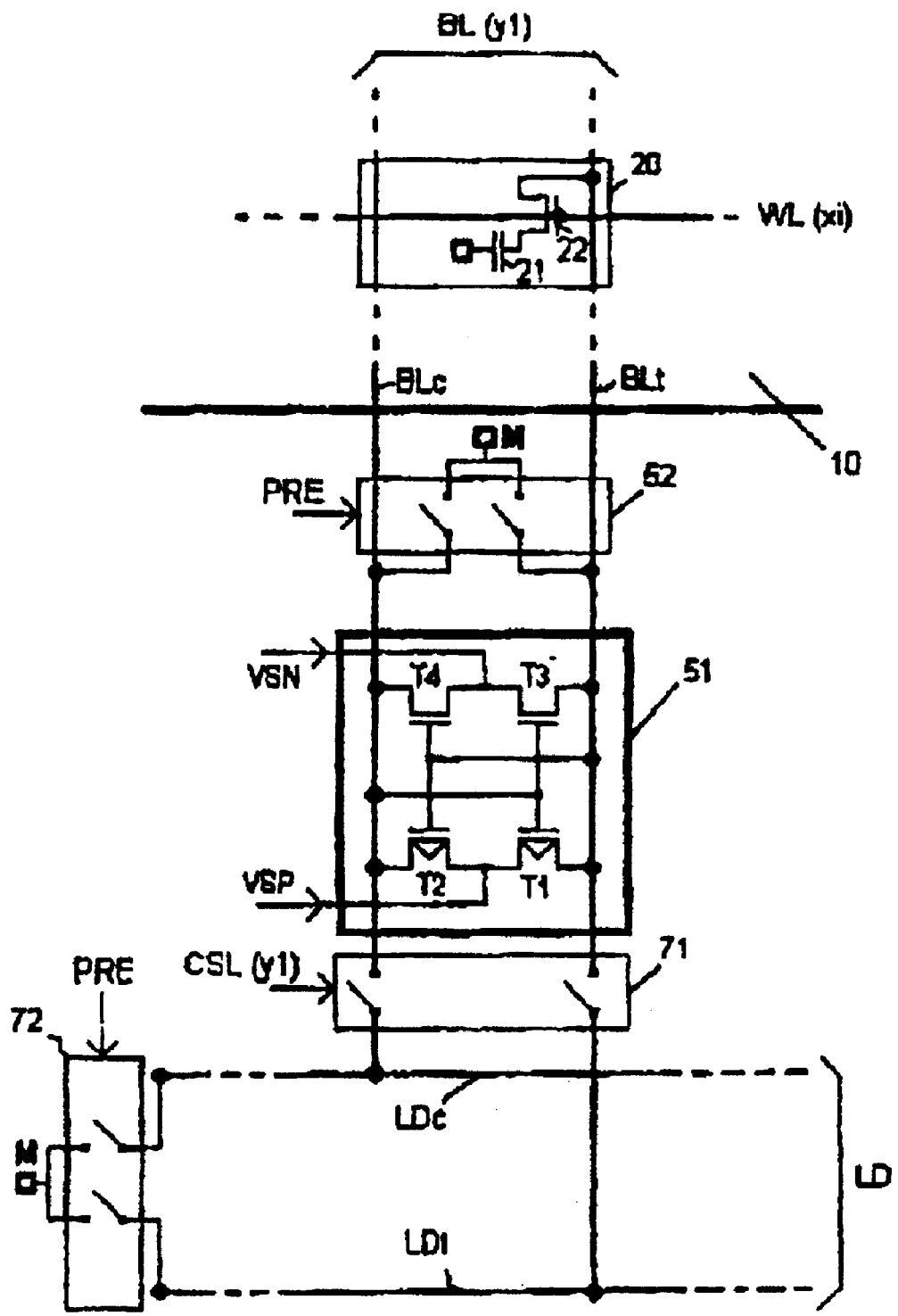
FIG. 2 is a block and schematic circuit diagram of a sense amplifier between a column of memory cells and an assigned data path network according to the invention.
Figure 3:
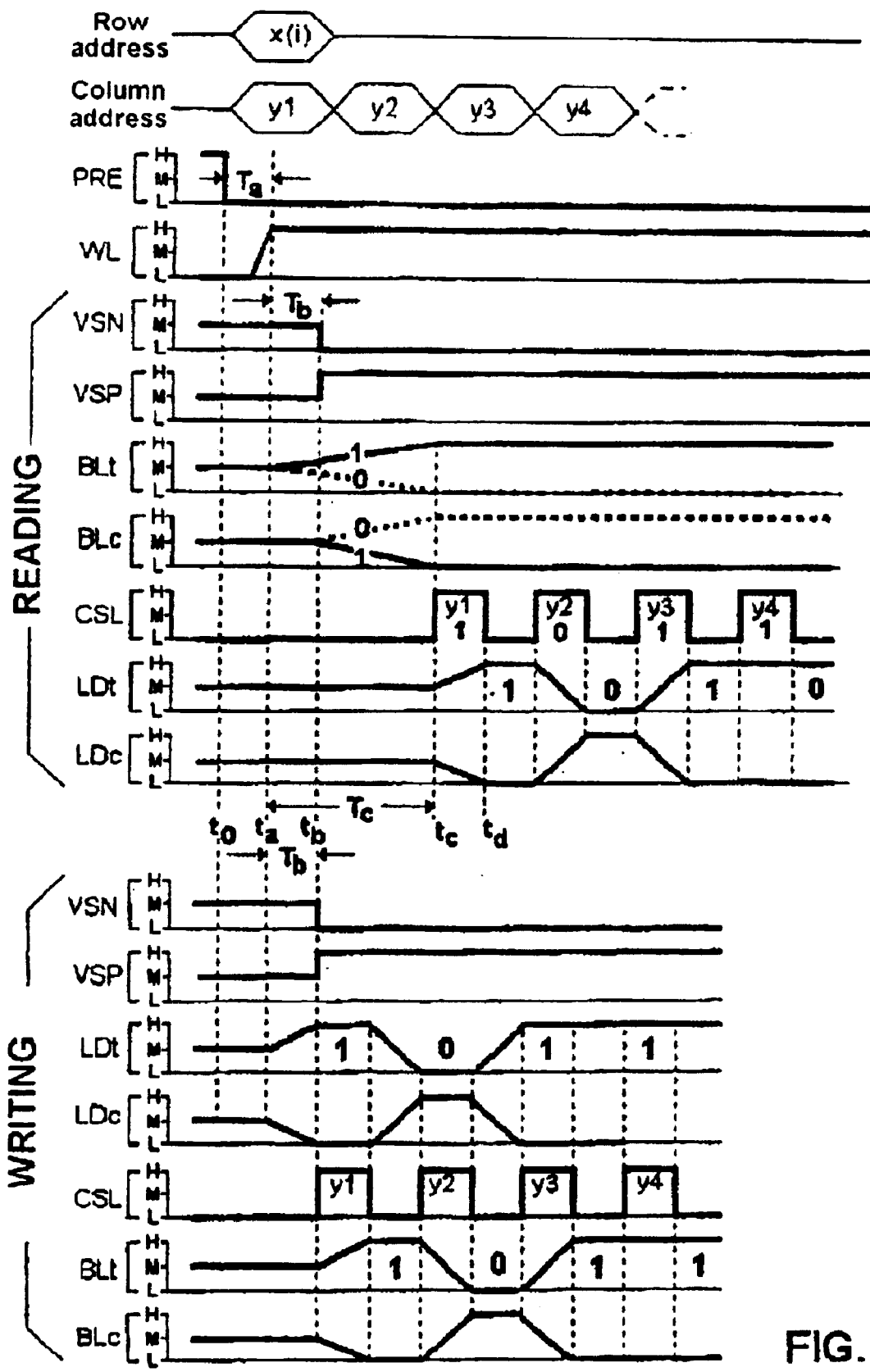
FIG. 3 are signal timing diagrams having a common time axis illustrating waveforms of different signals during writing and reading through the sense amplifier of FIG. 2.

The operations during reading and writing on a selected memory cell shall be explained below with reference to FIGS. 2 and 3. FIG. 2 shows a memory cell 20 in an arbitrary row x(i) and any column y1 of the memory matrix 10 and the data transfer path between the column and the data path network. FIG. 3 shows, in the form of a diagram against a common time axis, the temporal profile of the potentials at different locations and at control terminals of this transfer path.

Each memory cell of the matrix 10 is constructed in the same way as the memory cell 20 illustrated. It contains a capacitance (capacitor) 21, which forms the actual memory element and whose charge state represents the binary or data value "1" (charged) or "0" (uncharged). One side of the storage capacitor 21 is at fixed potential, and the other side is connected to one of the two cores of the assigned two-core bit line BL through the channel of a selection transistor 22 configured as an N-FET. The gate of the selection transistor 22 is connected to the assigned word line WL. In accordance with customary linguistic usage, one of the cores is referred to as a "true" bit line core BLt and the other is referred to as a "complement" bit line core BLc. In the case illustrated, the selection transistor 22 is attached to the true bit line core BLt, as are the selection transistors of all the other cells of the same word line WL. From word line to word line, the way in which the selection transistors are connected alternates between true and complement bit line cores.

In accordance with FIG. 2, the data transfer circuit connected to the bit line cores BLt and BLc contains a sense amplifier 51 with a symmetrical input and a symmetrical output. The sense amplifier 51 contains a first transistor pair, including two p-channel field-effect transistors (P-FETs) T1 and T2, and a second transistor pair, including two n-channel field-effect transistors (N-FETs) T3 and T4. The source electrodes of the P-FETs T1 and T2 are coupled together at a circuit point to which a first (positive) bias voltage potential VSP can be fed. The source electrodes of the N-FETs T3 and T4 are coupled together at a circuit point to which a second (negative) bias voltage potential VSN can be fed. The drain electrodes of the transistors T1 and T3 and the gate electrodes of the transistors T2 and T4 are connected to the bit line core BLt and can, additionally, be connected through a first branch of a two-pole data line switch 71 to a first core LDt of a local data line LD. In a similar manner, drain electrodes of the transistors T2 and T4 and the gate electrodes of the transistors T1 and T3 are connected to the bit line core BLc and can, additionally, be connected through the second branch of the data line switch 71 to a second core LDc of the local data line LD.

In the quiescent state of the memory circuit, before the initiation of a cell access, all the word lines are held at L level so that the selection transistors of all the cells are in the off state, and the bit line cores BLt and BLc are held at a common precharge potential M, which lies as exactly as possible between L level and H level. This last is effected by a precharge switch 52, which is symbolically represented as a two-pole mechanical switch and is closed by a precharge signal PRE in order to connect the two bit line cores BLt and BLc to a source of the M potential. A similar precharge switch 72, which is controlled by the precharge signal PRE in the same way, is situated on the cores LDt and LDc of the local data line LD in order also to level these cores at M potential. During the quiescent state, the signals VSN and VSP are held at M level so that the sense amplifier 51 is in the floating state. Furthermore, the data line switch 71 is open in the quiescent state so that the sense amplifier 51 is disconnected from the local data line LD.

The data line switch 71, the local data line, and the precharge switch 72 are part of the data path network 70 (FIG. 1). The data path network usually includes a plurality of local data lines, each of which is assigned to a subset of the columns or sense amplifiers and each of which is connected to a master data line through a master data line switch. A plurality of memory cells of the respectively selected row can, thus, be accessed simultaneously. Bidirectional secondary data amplifiers are usually provided at the ends of the master data lines. These amplifiers and the master data lines also form part of the data path network 70.

To initiate a cell access for reading or writing in a selected row, firstly, at the instant $t_0$, the signal PRE is deactivated by an operation-start signal to open the precharge switches 52 on the bit lines of all the columns and the precharge switches 72 on all the local data lines LD and thus to disconnect the cores BLt and BLc of the bit lines BL and the cores LDt and LDc of the local data lines LD from the M potential. The operation-start signal also has the effect that, shortly afterwards, at an instant $t_a$, the word line WL of a row selected by a row address is activated, i.e., is raised to H level, so that the selection transistors 22 in all the memory cells 20 of the relevant row are turned on. This is done, in that, the word line driver 30 (FIG. 1) selected in accordance with the coded row address from the row decoder is activated. Therefore, the row address must be valid at the correct time. The interval $T_a = t_a - t_0$ is governed by the system and corresponds to the period of time that elapses from the start of operation until the row address is decoded in valid fashion and the selected word line WL has reached its H level.

After this initiation of the cell access, a read operation can begin, as explained in the following text.

Read Operation

If the illustrated cell 20 of the addressed row is charged, that is to say, stores the binary value "1," a small raising of the potential above the M level takes place on the assigned bit line core BLt. As a result, BLt becomes positive with respect to BLc. This case is shown by the solid waveform in FIG. 3. By contrast, if the cell 20 is uncharged, that is to say, stores the binary value "0," a small lowering of the potential below the M level takes place on the bit line core BLt. As a result, BLt becomes negative with respect to BLc. This case is shown by the waveform depicted in dashed fashion in FIG. 3.

A short time later, after a safety time $T_b$ has elapsed at the instant $t_b$, when the change in potential on the bit line core BLt has reached an extent that can be unambiguously discriminated from noise phenomena, the signal VSN is switched to L level and the signal VSP to H level. The sense amplifier 51 is, thereby, switched on, in that, it, then, receives its full supply voltage and its operating current from the sources of the two signals. If a raising of the potential has taken place on BLT, as depicted in solid fashion in FIG. 3, then the transistors T1 and T4 are driven in the direction of increasing conductivity and the transistors T2 and T3 are driven in the direction of increasing blocking so that BLt is pulled in the direction toward the H potential of VSP and the other bit line core BLc is pulled in the direction toward the L potential of VSN. On account of the positive feedback between T1 and T4 and between T2 and T3, or the negative feedback between T1 and T2 and between T3 and T4, this operation leads to the latching of the final state so that the data value "1" is latched in the sense amplifier. By contrast, if BLt became negative with respect to BLc at the moment when the sense amplifier was activated, as depicted by broken lines in FIG. 3, then this results in the opposite final state (latching of a "0") in which BLt is pulled to L level and BLc is pulled to H level. The potential difference between the bit line cores BLt and BLc, which is "pulled apart" in the respective final state, is transferred back to the memory cell, the storage information of which is refreshed in this way. At the instant $t_c$, this operation is terminated and the sense amplifier 51 is fully activated.

The reading control described thus far proceeds on all the columns simultaneously so that, at the instant $t_c$, the sense amplifiers assigned to the other columns (not shown in FIG. 2) are also in the latched state. A selected specimen of the sense amplifiers 51 can, then, be connected to the data path network 70 through the local data line LD for a read operation. If the illustrated memory cell 20 of the column y1 is to be the first to be read out, the data line switch 71 assigned to this column is closed at the instant $t_c$, to be precise, by activation of a column select signal CSL(y1) that is assigned to this switch and is generated by the column decoder 60 in accordance with the column address that has already been loaded into the address buffer 82 beforehand and is fetched from the address buffer 82 at the instant $t_c$.

With the closing of the data line switch 71 at the instant $t_c$, the potential difference of the bit line cores BLt, BLc, which is "pulled apart" in the manner described, is coupled onto the local data line cores LDt, LDc that were put at M potential in the quiescent state by the precharge switch 72 and have still maintained this potential even after the opening of the switch 72 (instant $t_0$). As an example, it shall be assumed that the accessed memory cell of the column y1 contained a "1". Consequently, starting from the instant $t_c$, the local data line core LDt rises from the M level to H level, and LDc falls from M level to L level (the situation is reversed in the case of reading a "0"). When these levels are reached (instant $t_d$), the signal CSL(y1) can be deactivated, and the datum represented by the level difference H-L on the local data line can be latched into the data buffer 87 through the data path network 70, in order to be output through the I/O data port 88.

Afterward, while the word line continues to be kept activated and all the sense amplifiers remain switched on, further memory cells of the same row can be read out in relatively short succession, in that, the data line switches 71 of further columns y2, y3, y4, etc. are temporarily closed by assigned column select signals CSL(y2), CSL(y3), CSL(y4). Such a "fast page" mode is illustrated in FIG. 3. In the case shown of reading a "0" from column y2, LDt goes to L level, and LDc goes to H level; in the case shown of respectively reading a "1" from the columns y3 and y4, LDt goes to or remains at H level, and LDc goes to or remains at L level. After each of the CSL pulses, the datum respectively read out is available on the local data line LD as a potential difference H-L of positive polarity (corresponds to "1") or negative polarity (corresponds to "0") until the next CSL pulse and can be latched into the data buffer 87.

As described above, the application of the column select signals CSL for the read-out can be begun at the earliest at the instant $t_c$ once all the charging operations until the stable final states of the sense amplifiers have been reached have been ended, starting from the initiation of word line activation. As mentioned, this charging time $T_c = t_c - t_a$ is defined by the specification of the memory module.

Write Operation

The prior art initiates the write operation in the same way as the read operation, in that, the above-described sequence from the instant $t_0$ to the instant $t_c$ is allowed to proceed and only then, starting from the instant $t_c$, is the column selection carried out for writing. In the prior art, then, it is only at this point in time that the datum to be written in is permitted to be coupled onto the data path network 70 through the I/O data port 88 and the data buffer 87 in order to generate the potential difference corresponding to the datum on the cores of the responsible local data line LD. If this datum is identical to the previous storage information, there is no change to the switching state of sense amplifier 51. However, if the new information is the opposite binary value (potential difference reversed), then the sense amplifier 51 must be toggled into the other switching state.

In a departure from this prior art, according to the invention, an "immediate"-write operation is started in which, with the column selection, there is no waiting until the abovementioned charging time $t_c$ has elapsed. The write operation is started significantly earlier, at the latest, with the activation of the word line at the instant $t_a$, as illustrated in the lower part of FIG. 3.

As early as at the instant $t_a$ (or even earlier, at the earliest with removal of the precharge signal PRE at the instant $t_0$) the first datum to be written in is fetched from the data buffer 87 in order to apply the potential difference corresponding to this datum to the cores LDt and LDc of the responsible local data line LD in the data path network 70. For such a purpose, the I/O data port 88 is conditioned for reception in good time, preferably, likewise at the instant $t_a$. As an example, it shall be assumed that the first datum to be written in has the binary value "1" and is to be written to the memory cell 20 of the column y1. Consequently, LDt rises from the M level to H level, and LDc falls from the M level to L level. This occurs relatively rapidly due to the amplifying effect of the abovementioned secondary amplifier in the data path network 70.

After the safety time $T_b$ has elapsed, that is to say, at the instant $t_b$, the sense amplifiers 51 are switched on by application of the supply potentials VSN and VSP. At this instant $t_b$, the potential difference on the local data line LD has also stabilized, and the column select signal CSL(y1) is applied in accordance with the column address y1, which must be valid at this point in time. This closes the data line switch 71 for the relevant column so that the assigned sense amplifier 51 is latched into that switching state that corresponds to the data value "1." BLt of the bit line pair BL(y1), thereby, rises to H potential, while BLc falls to L potential so that the storage capacitor 21 in the memory cell 20 at the column position y1 is correspondingly charged to store the "1." This also occurs relatively rapidly due to the amplifier effect of the sense amplifier 51.

After a first datum has been so written, the write cycle can be continued, in that, first, the column select signal CSL(y1) is taken away and the next datum (e.g., a "0") for the memory cell at the column position y2 of the activated row is-fetched from the data buffer 87. LDt, thereby, goes to L level, while LDc goes to H level. Once these levels have been reached, the column select signal CSL(y2) is applied in accordance with the column address y2, which must be valid at this point in time. This leads to the writing of the "0" to the memory cell at the column position y2. The write cycle can be continued further in a similar manner to successively write in further data (e.g., "1," "1") at further column positions y3, y4, etc., as illustrated in FIG. 3.

At all other (non-addressed) column positions of the respectively activated row x(i), starting from the instant $t_a$, the bit line cores BLt and BLc are charged in accordance with the previously stored data values, in a similar manner to that in the case of the read operation shown in the upper part of FIG. 3, and the relevant sense amplifiers 51 (which are, likewise, switched on at the instant $t_b$) are latched into the states for writing back the previous data. The charging of the bit lines also begins at the column positions y2, y3, etc. which are addressed during the immediate-write operation after the first column position y1; however, at least some of these charging processes are terminated more or less early, depending on how rapidly the immediate-write cycle progresses.

Control Device for Read and Write Operation

For the timing control of the write and read cycles described above, there is provided in the memory circuit in accordance with FIG. 1 a control device having a command decoder 91 and a control signal generator 92. The interaction of these parts among one another and with the address buffer 82, the data buffer 87, and the I/O data port 88 is synchronized, through the clock lines depicted in dashed fashion in FIG. 1, by a clock signal CLK received externally through a clock buffer 80. This principle corresponds to the architecture of an SDRAM control.

SDRAM memory circuits are provided as standard with m command terminals for the application of a command word including m command bits, command bits KB1 to KBm, and, furthermore, two selection terminals for the application of a chip select command CS and a bank select command BS. The command decoder 91 in accordance with FIG. 1 has inputs for receiving these command bits KB[1:m] and select commands and decodes the m-bit command word to obtain therefrom internal commands for the selection of an execution program in the control signal generator 92, inter alia, an internal read command LES and an internal command SSM for the immediate-write mode. Usually, the assembly communicating with the memory circuit supplies three command bits that, for purely traditional reasons, are referred to as RAS (row address strobe"), CAS ("column address strobe"), and WE ("write enable").

Each of the execution programs in the control signal generator 92 prescribes a specific time sequence for supplying its control signals that control the actions of the various devices for precharge, read, and write operation on the memory matrix. These include: the generation of the operation-start signal STA for defining the start instant to (FIG. 3); the control of the precharge switches 52 and 72 by the signal PRE; the control of the address buffer 82 for fetching the row and column addresses; the control of the word line drivers 30 for the activation of the respectively selected word line WL(x) depending on the row address; the control of the sense amplifiers 51 by switching the supply potentials VSP and VSN on and off; the control of the data path network 70 by actuation of, inter alia, the data line switches 71 with the signal CSL(y) depending on the column address decoded in the column decoder 60 and by activation of the secondary data amplifiers at the ends of the master data lines (not shown); and, also, the control of the I/O data port 88 and of the data buffer 87. One of the execution programs in the control signal generator 92 is configured for the conventional read operation and is selected if the command decoder 91 decodes the internal read command LES from the external command signals.

According to the invention, the control signal generator 92 is configured such that it carries out an immediate-write execution program when the immediate-write command SSM appears. This program causes the control signal generator, at an instant to, to deactivate the precharge signal PRE (i.e., switch it to L level) and to fetch from the address buffer 82 the row address x(i) received for the row access and, at the same time, also the column address y1 of the memory cell that is to be written to first. It is, thus, ensured that both the row address x(i) and the first column address y1 are "valid" (i.e., decoded by the row decoder 40 and column decoder 60, respectively) early enough when the word line activation is effected.

The instants at which the data to be written are fetched from the data buffer 87 are also prescribed by the control signal generator 92 by the immediate-write execution program, as are the instants at which the sense amplifiers 51 are switched on by the potentials VSN and VSP and the column select signal CSL(y1) and the further column select signals CSL(y2), CSL(y3), etc. are generated, thus, resulting in the immediate-write operation in accordance with the lower part of the timing diagram illustrated in FIG. 3. The column addresses y2, y3, etc. are in each case fetched early enough by the immediate-write execution program (cf., the second row from the top in the diagram of FIG. 3) so that they are valid in good time for the generation of the respective column select signals in the column decoder 60.

The rapidly successive generation of the various column select signals CSL(y1), CSL(y2), etc. can be controlled by a suitable non-illustrated automatic machine in the data path network 70 itself, as is known per se in the case of SDRAMs, so that the control signal generator 92 need only transmit a signal BURSTSTART to activate the automatic machine. In the immediate-write mode described, the signal BURSTSTART is generated at the instant $t_a$ at the same time as the activation of the selected word line WL.

If the read command LES command appears instead of the immediate-write command SSM, there is selected in the control signal generator 92 an execution program that is stored therein for the reading of data, in which, in accordance with conventional technology, the various control signals for the read operation are generated in a time sequence as is illustrated in the upper part of FIG. 3. In this case too, the signal BURSTSTART can be used, although only at the earliest at the instant $t_c=t_a+T_c$ in order to start the successive selection of the column positions y1, y2, etc.

In the case of the above-described exemplary embodiment illustrated in FIG. 1, the command decoder 91 supplies the immediate-write command SSM. Accordingly, in such an embodiment, the command decoder 91 is modified in a manner according to the invention to decode the new command SSM from the external command bits. KB[1:m]. This has the advantage that an additional external control terminal is not needed. If the $2^m$ combination possibilities of the m command bits do not suffice, for additionally also including the information for decoding the new immediate-write command SSM, it is possible to employ a fast time division multiplex for the application of the command information, in that, two m-bit command words are applied one shortly after the other, e.g., a first command word upon the rising edge of the clock signal CLK, and the second command word upon the subsequent falling edge of the clock signal CLK. In a preferred embodiment of the invention, a suitable buffer memory device 93 is provided for such an option at the command inputs of the command decoder 91, which buffer memory device 93 buffer-stores the first command word for the duration of half a clock period. Consequently, upon the falling edge, all the necessary information is available, to be precise, including the information for generating the immediate-write command SSM in good time. The delay by half a clock period at the beginning of the write operation that has to be accepted in this case is small in comparison with the time gain obtained by virtue of the immediate-write operation.

In an alternative embodiment of the invention, it is possible to use a separate external terminal to apply the immediate-write command SSM externally, either through the command decoder 91 or directly to the control signal generator 92. This separate terminal (not shown in FIG. 1) may, additionally, be provided if desired. However, it is also possible to use a terminal that is already present and is provided for arbitrary dedicated special functions, for instance, the so-called "Data-mask" pin, which is normally used for the function of masking out data. Of course, the normally dedicated function cannot, then, be carried out.

The text above has described the ideal case in which the column selection for the immediate-write operation begins at the earliest possible instant after the word line activation, that is to say, directly when the safety time $T_b$ elapses at the instant $t_b = t_a + T_B$. However, a timesaving compared with the conventional write operation is obtained even when the column selection is begun at a point in time somewhat later than $t_b$ (e.g., only during the next clock pulse), provided that such a point in time appreciably precedes $t_c$, that is to say, appreciably precedes the elapsing of the charging time $t_c$.

Expressed in general terms: according to the invention, the column selection is intended to begin at an instance $t_a + T_w$, where $T_w$ is at least equal to the safety time $T_b$ and is appreciably less than the charging time $T_c$. It must also, generally, be demanded that the first column address for the writing of a burst of successive data is decoded in valid fashion at the latest at the instant $t_a + T_w$. This, in turn, means that the column address to be decoded must be ready at the latest at an instant $t_r + T_w$, where $t_r$ is the instant at which the row address is provided.

If the memory circuit contains a plurality of memory banks, as indicated in FIG. 1, the selection of the respective bank to be operated and, thus, also of the respectively responsible group of sense amplifiers and of the responsible data path network is, likewise, effected by the control signal generator 92 depending on additional bank address bits. These bits are transferred, e.g., on the row address bus 83, which is, therefore, also connected to the control signal generator 92.

In FIG. 1, the group of sense amplifiers 51, for each bank, is depicted as a single block at the lower edge of the memory bank, for the sake of simplicity. As is known, in practice, each memory bank is usually subdivided into a multiplicity of row-parallel segments, and the sense amplifiers are disposed in strips on both sides of each segment and are in each case responsible only for the column sections of the directly adjacent segments.

The diagram of FIG. 3 is not to scale along the time axis, in particular, as far as the ratio of the charging time $T_c$ to the length of the other time sections is concerned. A typical value for the safety time $T_b$ is of the order of magnitude of a few nanoseconds, and the total charging time $T_c$ is about twice as long. In this typical case, with the invention, a timesaving of a few nanoseconds can, thus, be achieved for each write operation.

Whereas FIG. 1 illustrates the architecture of a control device for the realization of the invention on an SDRAM memory circuit, the immediate-write operation according to the invention may, of course, also be set up through interventions on DRAM memory systems of other types, e.g., on an RDRAM memory system, where the architecture of the internal control is similar, in principle, to that in an SDRAM; the main difference is in the interface through which the row and column addresses are applied to the address input within a very narrow time frame.

We claim:

1. A RAM memory circuit, comprising:

a multiplicity of memory cells disposed in matrix form in rows and columns, said cells storing datum, said rows having row addresses, said columns having column addresses;

word lines each being associated with a respective one of said rows;

sense amplifiers each being associated with a respective one of said columns;

data input/output means;

a data path connected to said sense amplifiers and to said data input/output means for transferring data in either direction between said sense amplifiers and said data input/output means;

each of said memory cells being addressable for writing in or reading out a datum by activation of said one word line associated with a respective one of said rows and by connecting a sense amplifier associated with a respective one of said columns to said data path;

an addressing device having:
  a row decoder connected to said word lines for selecting said word line to be activated dependent upon a provided row address; and
  a column decoder connected to said sense amplifiers for selecting respective ones of said sense amplifiers to be connected to said data path dependent upon said column addresses provided thereto; and a control device connected to said word lines, said control device activating a selected one of said word lines and subsequently initiating a connection of said selected sense amplifiers to said data path, said control device, upon receiving an immediate-write command, being set to command a write operation to initiate a connection of said sense amplifiers selected by said column address provided to said data path at an instant $t_a + T_w$, where:

$t_a$ is an instant of an activation of said word line selected by said provided row address; and $T_w$ is less than a charging time necessary, starting from said word line activation, to transfer the datum stored in one of said memory cells of said respective one of said rows to said respectively selected sense amplifier and to amplify the datum at said respectively selected sense amplifier.

2. The RAM memory circuit according to claim 1, further comprising an address-providing device providing column addresses, at the latest, at an instant $t_r + T_w$, where $t_r$ is an instant at which a row address is provided.

3. The RAM memory circuit according to claim 2, wherein said address-providing device has means for simultaneously providing a row address and a column address.

4. The RAM memory circuit according to claim 3, wherein said address-providing device has an address input with separate input terminals for receiving an externally applied row address and an externally applied column address.

5. The RAM memory circuit according to claim 2, wherein said address-providing device has an address provider simultaneously providing a row address and a column address.

6. The RAM memory circuit according to claim 5, wherein said address-providing device has an address input with separate input terminals for receiving an externally applied row address and an externally applied column address.

7. The RAM memory circuit according to claim 2, further comprising a first address bus transferring said row addresses and a second address bus transferring said column addresses, said address-providing device being connected to said row decoder through said first address bus and being connected to said column decoder through said second address bus.

8. The RAM memory circuit according to claim 1, wherein:
said sense amplifiers have inputs; and
$T_w$ is equal to a safety time $T_b$, and $T_w$ elapses starting from an activation of said word line until a signal change, determined by the datum in said memory cells of said relevant row, at said inputs of said associated sense amplifier has reached a level that can be unambiguously discriminated from noise phenomena.

9. The RAM memory circuit according to claim 1, wherein said control device has a control signal generator for generating a first control signal for activating said selected word line and for generating a second control signal for connecting said selected sense amplifiers to said data path in accordance with temporal stipulations of an immediate-write execution program activated by said immediate-write command and, in an event of an activation of said immediate-write execution program, causes said control signal generator to generate said second control signal within a time frame $T_w < T_c$ beginning with activation of said word line.

10. The RAM memory circuit according to claim 9, wherein the RAM memory circuit is a synchronous DRAM memory circuit.

11. The RAM memory circuit according to claim 9, wherein said word lines, said sense amplifiers, said memory cells, said data path, said addressing device and said control device form a synchronous DRAM memory circuit.

12. The RAM memory circuit according to claim 1, wherein said control device has a command decoder decoding said immediate-write command from externally applied command bits.

13. The RAM memory circuit according to claim 12, wherein said command decoder decodes said immediate-write command from two directly successively applied words of m externally applied command bits in each case.

14. The RAM memory circuit according to claim 11, further comprising an input for application of an externally generated immediate-write command, said control device having a command decoder activating said immediate-write execution program in said control signal generator upon reception of the externally generated immediate-write command.

15. The RAM memory circuit according to claim 11, further comprising an input for application of an externally generated immediate-write command, said input being connected to said control signal generator to activate, upon reception of the externally generated immediate-write command, said immediate-write execution program in said control signal generator.

16. A synchronous DRAM memory circuit, comprising:
a multiplicity of memory cells disposed in matrix form in rows and columns, said cells storing datum, said rows having row addresses, said columns having column addresses;
word lines each being associated with a respective one of said rows;
sense amplifiers each being associated with a respective one of said columns;
data input/output means;
a data path connected to said sense amplifiers and to said data input/output means for transferring data in either direction between said sense amplifiers and said data input/output means;
each of said memory cells being addressable for writing in or reading out a datum by activation of said one word line associated with a respective one of said rows and by connecting a sense amplifier associated with a respective one of said columns to said data path;
an addressing device having:
a row decoder connected to said word lines for selecting said word line to be activated dependent upon a provided row address; and
a column decoder connected to said sense amplifiers for selecting respective ones of said sense amplifiers to be connected to said data path dependent upon said column addresses provided thereto; and
a control device connected to said word lines, said control device activating a selected one of said word lines and subsequently initiating a connection of said selected sense amplifiers to said data path, said control device, upon receiving an immediate-write command, being set to command a write operation to initiate a connection of said sense amplifiers selected by said column address provided to said data path at an instant $t_a + T_w$, where:
$t_a$ is an instant of an activation of said word line selected by said provided row address; and
$T_w$ is less than a charging time necessary, starting from said word line activation, to transfer the datum stored in one of said memory cells of said respective one of said rows to said respectively selected sense amplifier and to amplify the datum at said respectively selected sense amplifier.

17. A method for controlling an operation of writing data into a RAM memory circuit, which comprises:
providing a memory circuit having:
a multiplicity of memory cells disposed in matrix form in rows and columns, the cells storing datum, the rows having row addresses, the columns having column addresses;
word lines each being associated with a respective one of the rows;
sense amplifiers each being associated with a respective one of the columns;
data input/output means;
a data path for transferring data in either direction between the input/output means and the sense amplifiers; and
each memory cell being addressable for writing in or reading out a datum by activation of the one word line associated with a respective one of the rows and by connecting of a sense amplifier associated with a respective one of the columns to the data path;
providing an addressing device having:
a row decoder connected to the word lines for selecting the word line to be activated dependent upon a provided row address; and
a column decoder connected to the sense amplifiers for selecting respective ones of the sense amplifiers to be connected to the data path dependent upon the column addresses provided thereto;

activating a selected one of the word lines and subsequently initiating a connection of at least one associated selected sense amplifier to the data path;

initiating a connection of the selected sense amplifier selected by the column address provided to the data path at an instant $t_a+T_w$, where:

$t_a$ is an instant of an activation of the word line selected by the provided row address; and $T_w$ is less than a charging time necessary, starting from the word line activation, to transfer the datum stored in one of the memory cells of the respective one of the rows to the respectively selected sense amplifier and to amplify the datum at the respectively selected sense amplifier.

18. A method for controlling an operation of writing data into a RAM memory circuit, which comprises:

disposing a multiplicity of memory cells in a matrix of rows and columns, the cells storing datum, the rows having row addresses, the columns having column addresses;

associating each of the word lines with a respective one of the rows;

associating each of the sense amplifiers with a respective one of the columns;

connecting a data path to a data input/output device and to the sense amplifiers for transferring data in either direction between the input/output device and the sense amplifiers, each memory cell being addressable for writing in or reading out a datum by activation of the one word line associated with a respective one of the rows and by connecting of a sense amplifier associated with a respective one of the columns to the data path;

connecting a row decoder of an addressing device to the word lines for selecting the word line to be activated dependent upon a provided row address;

connecting a column decoder of the addressing device to the sense amplifiers for selecting respective ones of the sense amplifiers to be connected to the data path dependent upon the column addresses provided thereto;

selecting one of the word lines by activating the selected word line and subsequently initiating a connection of at least one associated selected sense amplifier to the data path;

initiating a connection of the selected sense amplifier selected by the column address provided to the data path at an instant $t_a+T_w$, where:

$t_a$ is an instant of an activation of the word line selected by the provided row address; and $T_w$ is less than a charging time necessary, starting from the word line activation, to transfer the datum stored in one of the memory cells of the respective one of the rows to the respectively selected sense amplifier and to amplify the datum at the respectively selected sense amplifier.

* * * * *